United States Patent [19]
Wilkes et al.

[11] 3,813,609
[45] May 28, 1974

[54] MULTIPLE STAGE SAMPLE NORMALIZING AMPLIFIER WITH AUTOMATIC GAIN PREDICTION

[75] Inventors: Don Earl Wilkes, Houston; Charles Larry Thompson, Stafford; Alan Fred Sedgwick, Houston, all of Tex.

[73] Assignee: Petty-Ray Geophysical, Inc., Houston, Tex.

[22] Filed: Nov. 27, 1972

[21] Appl. No.: 309,653

[52] U.S. Cl. ............... 330/51, 330/124 R, 330/151, 340/15.5 GC
[51] Int. Cl. ............... H03g 3/22
[58] Field of Search ......... 330/29, 51, 86, 124, 127, 330/151; 340/15.5 GC

[56] References Cited

UNITED STATES PATENTS 3,603,972 9/1971 Vanderford .................... 330/51 UX

*Primary Examiner*—Herman Karl Saalbach
*Assistant Examiner*—James B. Mullins
*Attorney, Agent, or Firm*—Arnold, White & Durkee

[57] ABSTRACT

A series of fixed gain amplifier stages is selectively coupled by respective electronic switch means to pick-off amplifier means A comparison circuit is coupled between the output of each amplifier stage and amplifier control means. The amplifier control means includes a gain range control circuit which allows the amplifier to gain range continuously during selected portions of a given channel time period, i.e., continuously which selects the highest possible amplifier gain at which the amplifier output is in a linear region. The stages are continuously and selectively coupled to the pick-off amplifier means by the electronic switch means, in response to the gain range control circuit. The control means further includes a rate gain computer circuit coupled to the gain range control circuit and to an analog-to-digital converter, wherein the rate gain computer circuit provides gain prediction means for determining the gain of the amplifier at a subsequent selectable data sample time or times. The amplifier is allowed to gain range in response to the gain range control circuit prior to performing the gain prediction process, whereupon the rate gain computer circuit overrides the gain range control circuit and sets the electronic switch means to select the amplifier stage commensurate with the predicted gain prior to taking the data sample.

18 Claims, 13 Drawing Figures

MULTIPLE STAGE SAMPLE NORMALIZING AMPLIFIER WITH AUTOMATIC GAIN PREDICTION

BACKGROUND OF THE INVENTION

1. Field

The invention relates to gain ranging data amplifiers, and particularly to a multi-stage, high performance amplifier with automatic gain prediction and sample normalizing performed under digital control.

2. Prior Art

Typical of gain ranging amplifiers are those classified as analog amplifiers with linear automatic gain control (AGC) circuits, and those classified as digital gain ranging amplifiers with binary gain increments.

In analog amplifiers, no provision is made for detecting the output therefrom, and for predicting exactly the gain of the amplifier, in order to determine the input signal level at any point in time for purposes of correcting the gain prior to taking the signal sample. Such systems are unduly slow, and the gain is generally set with respect to the maximum amplitude of the output signal envelope rather than to the value of the individual samples, causing a loss of information in the regions of output signal crossover.

In digital gain ranging amplifiers, use of binary gain increments allows a step-controlled AGC circuit, such that the amplifier gain is encoded as a digital signal. With such gain information, as well as the signal level information, the circuit determines the input signal level over a very wide dynamic range with very good resolution at any one level. However, in multi-channel seismic applications, a plurality of amplifiers must be utilized in a per-channel configuration, which presents problems concerning control of the AGC circuits. Furthermore, the AGC circuits thereof generally fail to respond rapidly enough, while still providing a distortionless signal for a particular seismic frequency range. Thus, problems inherent in digital gain ranging amplifiers cause limits to be placed on the gain ranging capabilities thereof. Such amplifiers range in gain more slowly than do the signal excursions, resulting in loss of signal information.

SUMMARY OF THE INVENTION

The present invention provides a multi-stage, high performance amplifier particularly useful in multichannel seismic exploration systems. The amplifier has improved frequency response to readily allow it to handle a large plurality of data channels while ranging in gain during each channel time period with sufficient speed to allow normalizing each data sample, i.e., sampling at the maximum resolution of the analog-to-digital converter.

The invention amplifier includes a plurality of fixed gain amplifier stages, wherein preferably, a first series of the multi-stage amplifiers is coupled to a first common buss via respective electronic switch means, and a second series of the amplifier stages are coupled to a second common buss via respective electronic switch means. The outputs from the first switch means are coupled in turn to sub-buss electronic switch means and thence to a buffer stage. The dual buss/(sub-buss) switch means/buffer stage configuration comprise means for providing isolation between the amplifier stages to preclude instabilities, while the buffer stage provides conversion from the relatively high impedance levels of the input circuits to a low output impedance signal for the output circuits. The buffer stage feeds a pick-off amplifier which includes attenuator means, wherein the latter, along with the selected fixed gain amplifier stages, provides gain changes in relatively small, e.g., 6 db steps, to allow maximum resolution.

Comparison circuits are coupled to the output of each amplifier stage and thence to a gain range control means, whereby free-running gain ranging is provided during selected initial portions of the channel time period. Gain prediction is provided via a rate gain computer means coupled to the gain range control means and to an analog-to-digital (A/D) converter which receives the amplifier output. A pair of samples are taken at selected intervals during the first portion of the channel time period via control by the rate gain computer means. Before and between the sample times, the gain range control means allows the amplifier to gain range to continuously select the amplifier gain which keeps the output therefrom in a linear region. Upon obtaining the first pair of samples, the rate gain computer means predicts the optimum amplifier gain for taking the subsequent data sample. The gain range control means is disabled and the rate gain computer means sets the gain of the multi-stage amplifier via control of the respective electronic switch means disposed between the various amplifier stages and the pick-off amplifier. The A/D converter thus takes each data sample at maximum resolution thereof to provide a normalized data output.

BRIEF DESCRIPTION OF THE DRAWINGS

FIG. 11A-11J are graphs depicting the timing sequences of various waveforms generated at selected points along the circuit combination of the invention.

DESCRIPTION OF THE PREFERRED EMBODIMENTS

Figure 1:
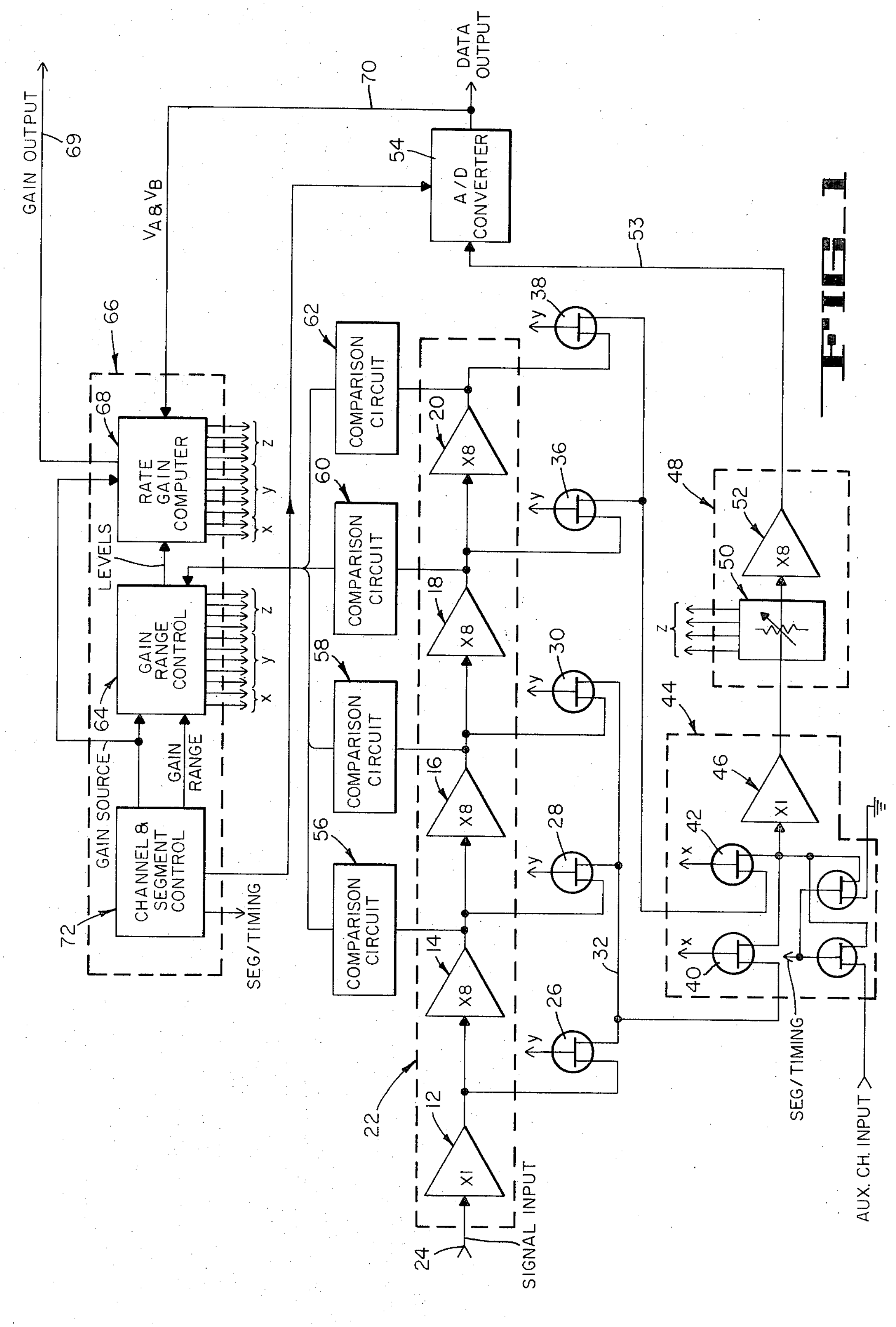
FIG. 1 is a block diagram exemplifying the basic combination of the invention multi-stage amplifier.

Although the present invention is herein described with reference to a multi-channel seismic exploration system, it is to be understood that the combination may be utilized for single or multi-channel applications wherever high performance amplifiers are required, such as, for example, in information retrieval systems, medical electronics, process control systems, or other data acquisition systems.

referring to FIG. 1, the basic combination of the invention includes a selected plurality of amplifier stages 12, 14, 16, 18 and 20 serially disposed to define a multi-stage amplifier 22. Amplifier stages 14–20 are fixed-gain operational amplifiers of generally conventional design, having a gain of times eight (X8), and thus referred to hereinafter as octet amplifiers. The first amplifier stage 12 is a buffer or isolation stage for isolating the subsequent amplifier stages from an input circuit such as, for example, a conventional multiplexer circuit (not shown) as commonly employed in multi-channel seismic exploration systems. The first amplifier stage 12 includes an amplifier of times one (unity) gain, and is hereinafter referred to as an "isolation" stage. As shown, the octet amplifier stage 14, 16 are coupled via electronic switch means 28 and 30 to a common buss 32. The octet amplifier stages 18 and 20 are coupled to a second common buss 34 via respective electronic switch means 36, 38.

The two common busses 32, 34 are in turn coupled via respective electronic switch means, herein termed sub-buss, or buffer switch means 40, 42, to a buffer stage 44 formed of a times one (unity) operational amplifier 46. The buffer stage 44 provides means for switching between the two common busses 32, 34 and, in combination with the isolation stage 12 and dual buss configuration, also provides isolation between the input circuit, the amplifier stages 14–20, and a pick-off amplifier stage 48. The latter stage includes a selectively stepped attenuator means 50 coupled from the unity amplifier 46 to a fixed gain pick-off amplifier 52 also having a times eight (X8) gain. The pick-off amplifier 52 in turn is coupled to an analog-to-digital (A/D) converter 54 of generally conventional design as employed, for example, in seismic exploration systems.

Comparison circuits 56, 58, 60 and 62 are coupled to the outputs of the octet amplifier stages 14–20 respectively, and provide means for detecting the level of the analog signal output from each stage. The outputs from the comparison circuits are fed to a gain range control means 64 of an amplifier control means 66. The control means 66 further includes a rate gain computer means 68 operatively coupled to the gain range control means 64, as well as the A/D converter 54. In addition, the amplifier control means 66 includes channel-and-segment control means 72 which generates the timing sequence for the channel time period, for the input circuit, i.e., the multiplexer (not shown), for the control means 64, 68, for the A/D converter 54, etc., as further described infra.

As depicted, the gain range control means 64 and the rate gain computer means 68 are digital logic circuits, each of which provides a similar plurality of binary control signals, herein designated as $x$, $y$ and $z$ controls. The means 64, 68 alternately control four switch means within the attenuator circuit 50 (FIG. 3), the switch means 26–30, 36, 38 of the amplifier stages 12-20, and the buffer switch means 40, 42 of the buffer stage 44 respectively, as further described below. The rate gain computer means 68 also provides a "GAIN OUTPUT" via a line 69, which is delivered to the processing apparatus (not shown) along with the "DATA OUTPUT".

In operation, the gain range control means 64 provides continuous control of the gain of the multi-stage amplifier 22 during the free-running operation thereof, at the speed of the logic circuits. At selected times during the channel time period generated by the control means 72, the rate gain computer means 68 provides controls $x$, $y$ and $z$ which override the controls $x$, $y$ and $z$ introduced to the switch means via the gain range control means 64. The rate gain computer means 68 takes a pair of samples for gain prediction purposes, at the existing gain continuously being set via the gain range control means 64 in response to the signal levels detected by the comparison circuits 56–62 and delivered to the computer means 68 via an analog "LEVEL" line (lines 144 of FIG. 4). That is, the outputs $x$, $y$ and $z$ from means 64 are fixed by a gain range signal from the channel-and segment control means 72, whereupon the rate gain computer means 68 takes a pair of samples by the A/D converter 54 at the existing gain, in he form of eight bit words.

More particularly, the rate gain computer means 68 includes a gain prediction circuit (FIGS. 5–8) which takes a first sample at a point in time $T_A$ a few microseconds after the beginning $T_O$ of the channel time period to allow the amplifier to settle, and takes a second sample at time $T_B$ a few microseconds after time $T_A$. The gain prediction circuit then determines the slope of the analog signal between points $T_A$ and $T_B$ utilizing a linear slope prediction circuit, and computes the maximum value of the analog signal at subsequent channel period times $T_C$ and $T_D$. The gain of the amplifier 22 is then set by the control outputs $x$,$y$ and $z$ of the rate gain computer means 68 during the remainder of the channel time period in response to the computation, in order to take a data sample at near full-scale of the A/D converter 54. That is, the samples are normalized, i.e., each is taken at the maximum resolution of the A/D converter 54.

The gain range control means 64 controls the gain of the multi-stage amplifier 22 during the free-running period thereof, i.e., during the channel time periods between $T_O$ and $T_A$, and $T_A$ and $T_B$. During the free-running periods, the A/D converter 54 is feeding the digitized values of the analog signal corresponding to the input signal level amplified to the selected gain by the gain range control means, by the line 70 to the rate gain computer means 68. During the free-running period the amplifier gain is continuously changed in response to the signal levels detected by the comparison circuits 56–62, and the action of the gain range control means 64 which selects the highest possible amplifier gain while keeping the amplifier output in a linear region, in preparation for taking the gain prediction samples $V_A$,$V_B$. The A/D converter 54 takes samples for input to the rate gain computer means 68 when the gain range control means is fixed, i.e., at times $T_A$ and $T_B$. The actual data sample, or samples, are taken and delivered from the A/D to a recorder, processor, etc., by the data output line.

Thus, as may be seen, the $y$ outputs from the gain range control means and the rate gain computer means 64, 68 alternately control the five switch means 26–30 and 36, 38 on busses 32, 34 respectively. Simultaneously, the $x$ outputs therefrom alternately control the buffer switch means 40, 42 to select one of the common busses 32, 34 and thus complete the circuit from the octet amplifier stage outputs to the pick-off amplifier stage 48. The attenuator means 50 provides improved resolution, i.e., provides relatively small gain steps (e.g., 6*db*) when coupled in selected combination with the octet amplifier stages by means of four switch means (FIG. 3) integral with the attenuator means 50. The latter switch means are simultaneously controlled via the controls z from either control means 64 or computer means 68.

The invention employs two common busses rather than one, in combination with the (isolation) buffer stages 12 and 44, in order to prevent crossfeed due to the series of amplifier stages 14–20. That is, each of the stages has electronic switch means whose isolation capability is not sufficient to withstand the difference in signal levels that exist, for example, when the signal is directed through the multi-stages. Leakage impedance across the switch means 26 causes a positive signal feedback condition, causing in turn oscillation problems, i.e., an unstable amplifier condition. The duel buss configuration provides optimumly stable amplifier operation.

Figure 2:
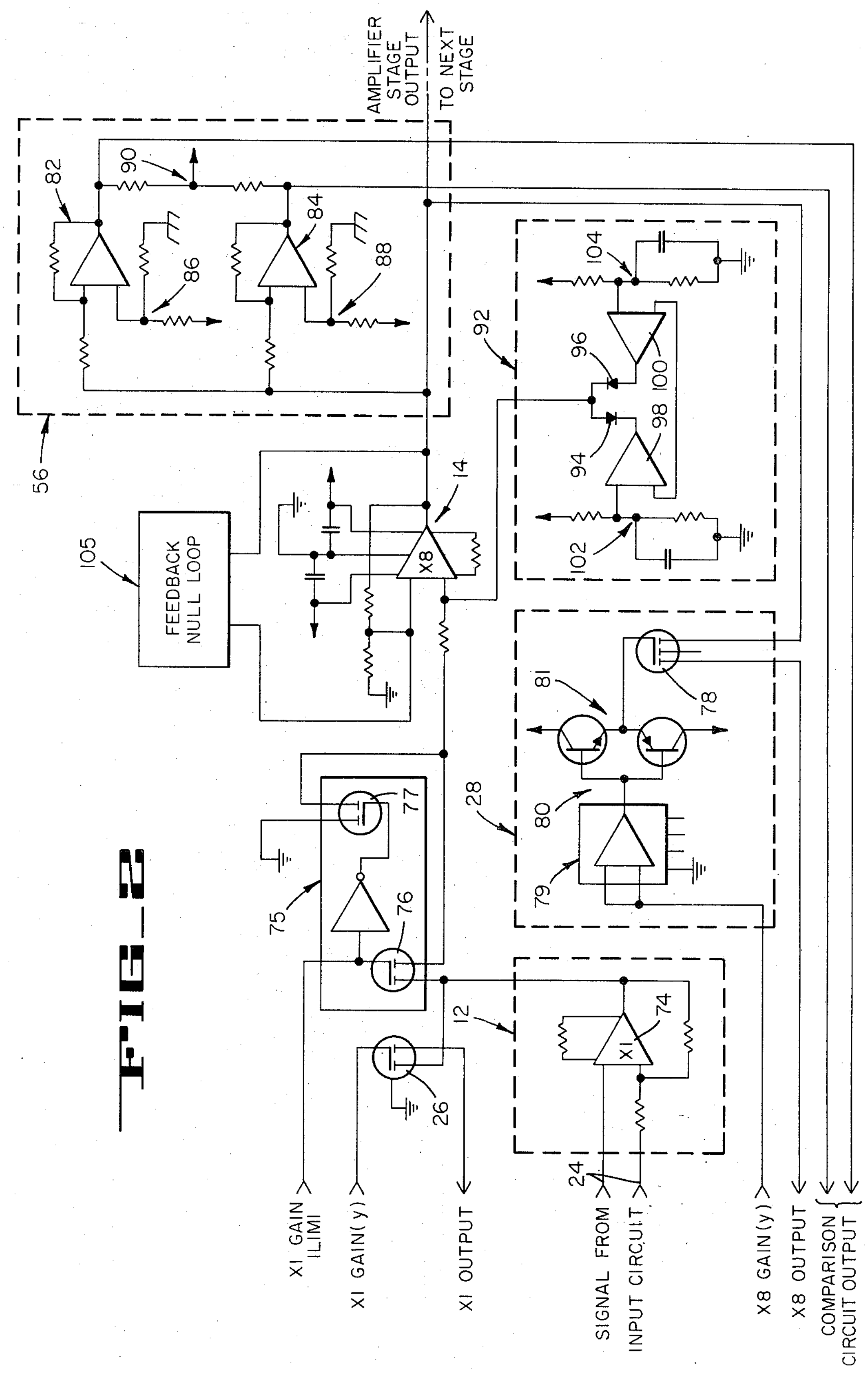
FIG. 2 is a schematic diagram exemplifying in further detail the isolation and first stages of the multi-stage amplifier of FIG. 1.

Referring to FIG. 2, input signal information is introduced to input terminals 24 as from a multi-channel multi-plexer unit (not shown) commonly used in seismic exploration systems, as previously described in FIG. 1. The signal information is fed to a unity amplifier 74 of the isolation stage 12 of previous mention, which in turn is coupled to the electronic switch means 26, as well as to an additional isolation switch means 75. The latter includes a pair of field effect transistor (FET) switches 76,77 which simultaneously open the line to the series of amplifier stages 14–20, and ground stage 14 respectively. The FETs 76, 77 and switch means 26 are triggered by essentially the same control y ("X1 GAIN") with suitable delay therebetween. Switch means 75 provides isolation between the isolation stage 12 and the series of amplifier stages 14–20 upon closure of the switch means 26. The switch means 75 is not essential to the operation of the amplifier, but is employed to give amplifier stages 14–20 additional time to recover from large input signals when the amplifier stages 14–20 are not in the signal path of the system.

The isolation and first amplifier stages 12 and 14 are shown in FIG. 2 to illustrate the inputs and outputs for each of the stages 14–20. Thus the octet amplifier stages 16–20 are likewise coupled to circuits analogous to those discussed with respect to stage 14, FIG. 2.

To illustrate, the "X1 OUTPUT" from the switch means 26 is the line coupled to the common buss 32 of FIG. 1. The trigger signals herein termed "X1 GAIN", and "X1 GAIN/ILIMI" actuate the switch means 26 and 75 respectively; the former being one of the y outputs from either 64 or 68, the latter being generated via the means 64. The electronic switch means 28 includes FET 78 which is coupled from the output of the octet amplifier stage 14, to the common buss 32, as shown in FIG. 1, to provide an X8 output. As may be seen, closure of the switch means 26 provides a direct output to the pickoff amplifier stage 48 from the isolation stage 12, whereby no amplification is performed on the signal, i.e., all of the octet amplifier stages 14–20 are bypassed. On the other hand, with no signal to switch means 26, closure of the switch means 28 via the "X8 GAIN" control (another y control) provides a signal amplification of X8. The signal is amplified by an additional gain of eight upon passage through each succeeding stage 16–20 upon sole closure of the respective switch means 30–38, via respective control signals "X64 GAIN", "X512 GAIN" and X4096 GAIN" corresponding to the remaining controls y of FIG. 1. As further depicted in FIG. 2, the FET 78 is fed the "X8 GAIN" control via an interface circuit 80 formed of an operational amplifier 79, which acts as a buffer to restore the correct logic levels and removes surface transients to preclude false switching. Circuits 80 also includes two transistors defining a current amplifier 81 which increases the drive to the FET 78. Each switch means 26–38, 40, 42 and 116, 118 (FIG. 3) may include a similar interface circuit 80.

The comparison circuit 56 is counted to the output of the octet amplifier stage 14 and includes a pair of operational amplifiers 82, 84. The levels of the amplifiers 82, 84, and thus the level detected by the comparison circuit 56, is set via bias resistors, 86, 88 respectively. A voltage divider 90 is disposed across the output of the amplifiers 82, 84, whereby the outputs from the amplifiers 82, 84 are fed to the gain range control means 64 of FIG. 1 via the output terminals labeled "comparison circuit outputs." The outputs are thus digital signals which are representative of a preselected range of the analog input, i.e., of the analog signal information being fed to the amplifier 22.

A limiting circuit 92 is coupled to the input to the octet amplifier stage 14 and includes a pair of diodes 94, 96 and a pair of operational amplifiers 98, 100 respectively. A pair of voltage divider networks 102, 104 coupled to positive and negative voltage sources, respectively, are connected to the operational amplifiers 98, 100, wherein the combined circuits provide, in essence, means for "disconnecting" the amplifier stages when overscaled to prevent saturation thereof. The limiting circuit 92 thus provides means for setting the level of the analog signal from the amplifier stages 14–20 to avoid overloading or saturating the succeeding amplifier stage, thereby optimizing the speed of the amplifier 22. The limiting voltages applied via the networks 102, 104 and the diodes 94, 96 are selected to provide the desired range of signal amplitudes which are to be passed without being limited. The limiting circuit 92 may be replaced, for example, by a FET switch which disconnects the amplifier stages rather than allow them to saturate. On the other hand, if an amplifier with a suitably fast recovery after saturation (heretofore unavailable) is utilized, there is no need for a limiting circuit, disconnect FET, etc., since the response of the amplifier 22 would be sufficiently fast to allow recovery without loss of information even though previously driven to saturation.

A null loop 105 is included in the circuit of FIG. 2 by way of exemplifying means for correcting for any low frequency AC or DC offset, or drift, of the amplifier stage 14 (and/or of succeeding stages 16–20, 44 and 48). Any of various correction schemes may be utilized, e.g., a balance potentiometer coupled to each stage output and adjustable to obtain zero offset, as well known in the art. Or the offset error value can be stored and correction performed subsequently during digital processing of the data, etc. A similar offset correcting means (105) is employed with each of the stages 14–20, as well as with amplifiers 46, 52, etc., wherever offset correction is desired. It is understood that the nulling process is performed when the amplifier 22 is switched to the null channel of the system.

Figure 3:
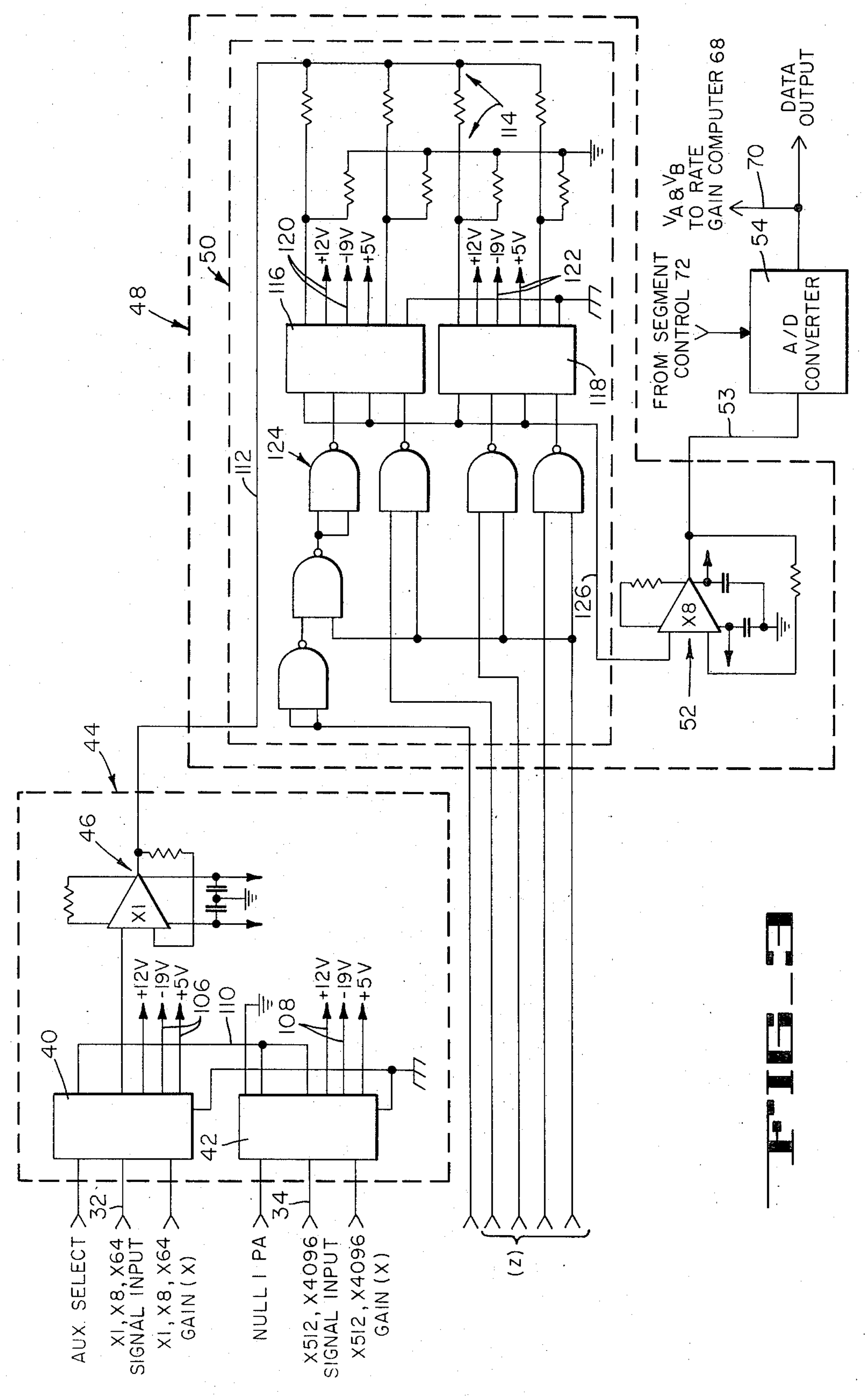
FIG. 3 is a schematic diagram of the buffer and pick-off amplifier stages of the circuit of FIG. 1.

FIG. 3 shows further details of the buffer stage 44 and the pick-off amplifier stage 48 of FIG. 1. The buffer stage 44 serves as an isolation stage, and converts the relatively high impednace levels of the input (herein the multiplexer unit of previous mention) to a low output impedance signal for driving the attenuator circuit 50 of the pick-off unity amplifier 46. This is to provide an accurate, predictable, set of gain range levels to improve A/D converter resolution. Thus the pick-off amplifier 52, in combination with the four octet amplifier stages 14–20, provides a total of 90 db of automatic gain ranging which, within the seismic format employed here by way of example only, is sufficient to cover the signal range in the seismic industry. The 0 to 90db range is herein provided in 6db steps during gain ranging via the combined octet amplifiers and the stepped resistors of the attenuator circuit 50, as controlled via the respective switch means of previous description. Obviously, a greater or lesser number of stages, and/or values for the fixed gain amplifiers may be utilized in place of those specifically described herein.

More particularly, the switch means 40, 42 comprise in essence analog switches of the type fabricated by Siliconix as Model No. DG181. The input lines herein labeled "X1, X8, X64 SIGNAL INPUT" and"X512, X4096 SIGNAL INPUT" are introduced to the switch means 40, 42 from the common busses 32, 34 respectively of FIG. 1. The switch means 40,42 are further provided with controls "X1, X8, X64 GAIN" and "X512, X4096 GAIN" respectively (corresponding to the *x* controls) which energize the respective switch means 40, 42 to couple the unity buffer amplifier 46 with the proper buss 32 or 34 respectively. "AUX SELECT" and "NULL 1 PA" inputs are also provided to the switch means 40, 42. The "AUX SELECT" control removes the buffer stage 44 from the gain mux, i.e., opens switch means 26–30 and 36–38, and converts it to the auxiliary inputs. The "NULL 1 PA" control grounds the buffer stage 44 during null periods. Various voltage levels are applied to the switch means 40, 42 via sets of lines 106, 108 respectively. The usual digital and analog grounds are also provided to the switch means. An output from switch means 42 is provided via line 110 to switch means 40 whose output in turn is fed to the unity amplifier 46 of buffer stage 44.

The output from the buffer stage 44 is fed via line 112 to the pick-off amplifier stage 48, and particularly to the attenuator circuit 50. The attenuator circuit 50 thus includes a graduated resistor network, herein indicated via numeral 114, wherein the values are selected to provide fixed 6db steps between each branch of the resistor network. Selected input levels corresponding to the desired 6db levels are provided to a pair of switch means 116, 118 via voltage input lines 120, 122. Thus selected branches of the resistor network 114 may be selected via four FETs (not shown) disposed within the switch means 116, 118. The latter are analog switches of the multi-FET/driver type, similar to the single FET type utilized in the buffer stage 44, i.e., switch means 40, 42. The FETs within the switch means 116, 118 are selectively energized via a gating circuit 124 which in turn is coupled via input lines to the *z* controls from either the gain range control means 64 or the rate gain computer means 68, depending upon which is controlling. Thus by selectively controlling the inputs to the switch means 116, 118 via the *z* controls, the attenuator gain may be stepped in 6db steps in combination with the X8 gains of the octet amplifier stages 14–20. The outputs from the switch means 116, 118 are fed via line 126 to the input of the octet amplifier 52 of the pick-off amplifier stage 48. The output from the pick-off amplifier stage 48 is fed via line 53 to the A/D converter 54. The output from the A/D converter is fed via line 70 to the rate gain computer means 68 as shown in FIG. 1, and the converter 54 is controlled via A/D control signals from the channel and segment control means 72, as further described below.

Figures 4, 11:
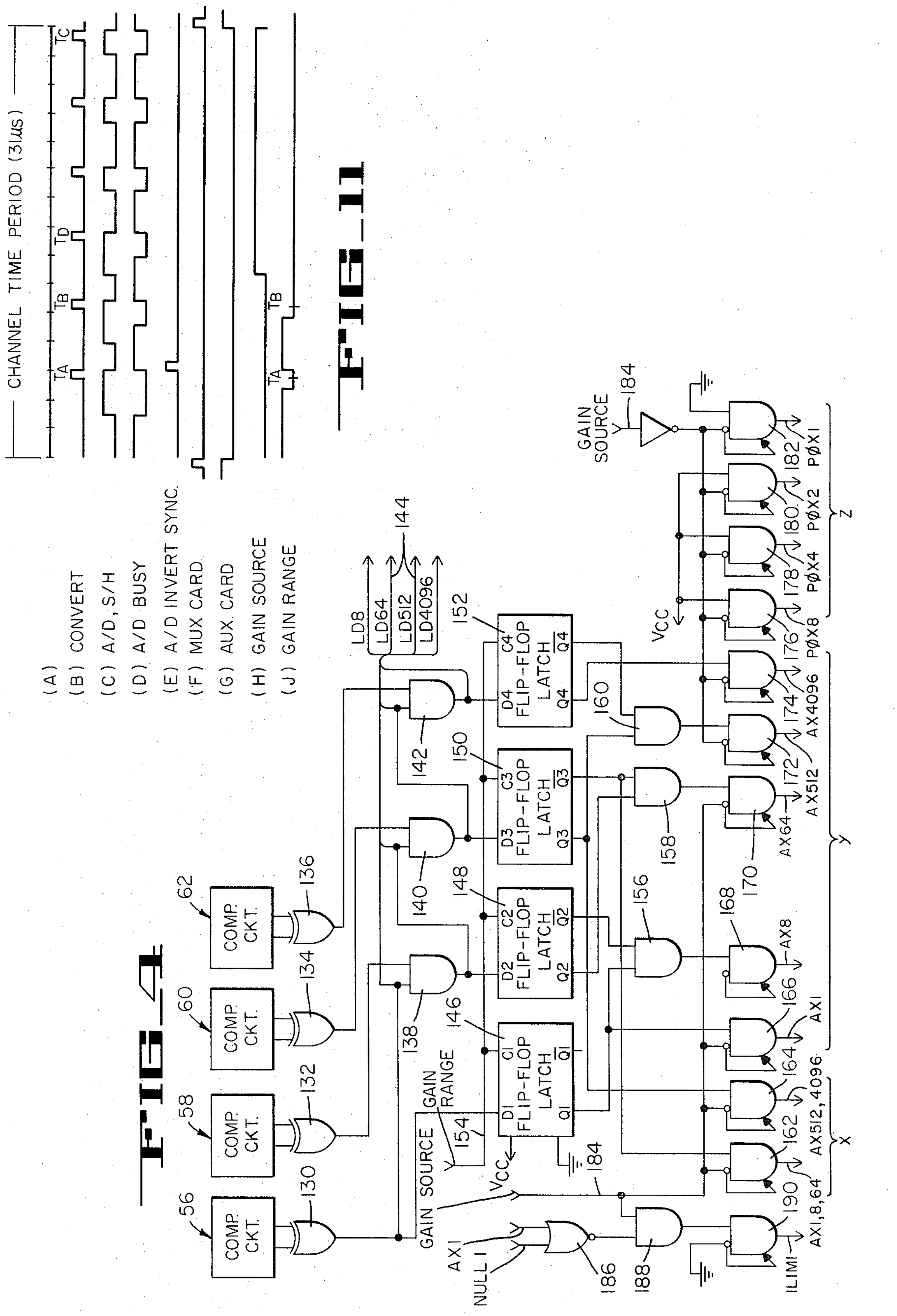
FIG. 4 is a schematic diagram of the gain range control means of the invention combination of FIG. 1.

Referring to FIG. 4 there is shown in greater detail the gain range control means 64 previously depicted in FIG. 1 as part of the amplifier control means 66. The gain range control means 64 is coupled to the comparison circuits 56–62 as shown in FIG. 4, via a like number of exclusive OR gates 130–136. The exclusive OR gates 132–136 are in turn coupled to respective AND gates 138–142, which insure that the gain range control means selects only one gain. The exclusive OR gate 130 is coupled to a second input to the AND gate 138, wherein the second inputs to AND gates 138–142 are coupled to output lines 144, which introduce the levels sensed by the comparison circuits 56–62 to the rate gain computer means 68 at such time as the gain prediction samples are taken ($T_A$ and $T_B$). The output of exclusive OR gate 130 is also coupled to the first flip-flop latch 146 of a series of latches 146–152. Controls for the state of the latches 146–152 is provided to input C via "GAIN RANGE" control line 154. The outputs from AND gates 138–142 are coupled to inputs D of the latches 148–152. The outputs from the AND gates 138, 140 are also introduced to the second input of AND gates 140, 142 respectively, while the output from AND gate 142 (as well as AND gates 138, 140) define the signal level outputs 144.

The digital outputs from the latches 146–152 and the AND gates 156–160 are selectively coupled to a series of controlled buffer gates 162–182, which act as high impedance buffers; i.e., when closed go from an active to a high impedance state. Buffer gates 162, 164 provide the *x* controls of previous mention; buffer gates 166–174 provide the *y* controls ("X1, X8, X64, X512 and X4096 GAIN" controls) and buffer gates 176–182 provide the z controls. The outputs of latches 146–152 are coupled to AND gates 156–160: latches 146–148 are coupled to AND gate 156, latches 148–150 are coupled to AND gate 158, and latches 150–152 are coupled to AND gate 160. The outputs of latches 146–152 and AND gates 156–160 are selectively coupled to buffer gates 162–174 which provide outputs *x*, *y*. A "GAIN SOURCE" control line 184 from the channel and segment control means 72 of FIG. 1, is selectively coupled to the control inputs to the buffer gates 162–182. In addition, a select voltage is supplied to the inputs of buffer gates 176–180. Thus, as may be seen, the flip-flop latches 146–152 are controlled via the "GAIN RANGE" control line 154, while the buffer gates 162–182 are controlled via the "GAIN SOURCE" control line 184, wherein the control lines 154, 184 are periodically fed via the preselected timing generated via the channel-and-segment control means 72. The latter means inter alia determines the channel time period (cf. FIGS. 6B and 11A, H and J) and thus the general timing for the logic operations of the invention combination, as further described below with reference to FIG. 11. In turn, the outputs *x*, *y* and *z* are utilized to control the switch means 26–30, 36–42 and 116, 118 shown in FIGS. 1–3 to provide the free-running gain ranging of the amplifier 22 prior to, and between, the taking of prediction samples for purposes of gain prediction as further described infra.

A pair of inputs "NULL 1" and "AX 1" are introduced to a NOR gate 186 from the channel and control 72 ("SEG. TIMING") and gain range control 64, and thence to an AND gate 188, which also has an input from the "GAIN SOURCE" control line 184. AND gate 188 feeds a buffer gate 190, whose control input is grounded and which provides an output "ILIMI" which is introduced to the isolation switch means 75 of FIG. 2 on input "X1 GAIN ILIMI," with a slight time delay after the X1 GAIN" control signal is fed to the switch means 26. Thus FET 76 is opened and FET 77 is closed to both isolate and ground the input to the series of stages 14–20 to improve amplifier recovery from large signals, as previously discussed.

In operation, referring to FIGS. 1–4, assuming the "GAIN RANGE" control line 154 is high, and the "GAIN SOURCE" control line 184 is low, the gain range control means 64 of FIG. 4 gain ranges at the speed of logic while seeking its own level, to determine continuously the gain of the amplifier 22 during selected portions of the channel time period (see FIG. 11). Thus, the outputs from buffer gates 162–182 and 190 are continuously introduced as $x$, $y$ and $z$ controls to the various switch means, to selectively set the latter to maintain the amplifier output within a linear range. Accordingly, when the amplifier 22 is gain-ranging, the rate gain computer means 68 provides no control of the various switch means, and the $x$, $y$ and $z$ output lines thereof are disabled. At this time the gain range control means 64 continuously provides digital control of the switch means via the analogous $x$, $y$ and $z$ control lines from buffer gates 162–182 of FIG. 4. Thus, the gain range control means 64 takes information from the comparison circuits 56–62, passes the information through the logic thereof, and introduces the resulting digital levels via the buffer gates 162–182 to the various switch means of previous mention in FIGS. 1–3.

At selected times $T_A$ and $T_B$ during the channel time period, samples $V_A$ and $V_B$ are taken to provide information for predicting the required gain for taking a subsequent data sample $v_C$, or samples $V_C \ldots V_D$, by the A/D converter 54. When taking $V_A$ and $V_B$, a low level is introduced to the "GAIN RANGE" control line 154 to latch the flip-flop latches 146–152. Thus, the information introduced via the gain range control means 64 is maintained for a selected period of time when "GAIN RANGE" is low, during which time the samples $V_A$ or $V_B$ is taken. At such time the components of the gain range control means 64 are fixed and are no longer operating at the speed of logic. That is, the gain range control 64 outputs are fixed and not allowed to change for a short period of time before sample $v_A$ is taken, and for a short period of time before sample $V_B$ is taken. After the rate gain computer 68 computes the required gain, the "GAIN SOURCE" line 184 goes high which places all the buffer gates 162–182 and 190 into the high impedance state, and transfers controls from the gain range control means 64 to the rate gain computer means outputs, to set the gain of the amplifier 22 for the remainder of the channel time period.

Both the "GAIN RANGE" and the "GAIN SOURCE" control lines 154, 184 are supplied from read-only memories within the channel-and-segment control means 72 in synchronism with preselected time periods of the chosen channel time period. As further described infra with reference to FIGS. 5–10, the pair of prediction samples may be utilized to provide sampling of a plurality of data samples rather than a single data sample, as heretofore described, wherein an average is taken of the plurality of samples to improve the signal-to-noise ratio. Thus, the channel-and-segment control means 72 is a fixed timing device which, in the particular seismic exploration apparatus described herein, provides means for synchronizing the invention combination with the multiple channel sampling system and the A/D converter output. The various timing sequences, and particularly the taking of prediction samples as well as data samples, is further described below with respect to FIGS. 5–10. In any event, whether the gain range control means 64 or the rate gain computer means 68 is controlling the various switch means, there is a static level on each of the $x$, $y$, $z$ and ILIMI output lines; i.e., a "1" or a "0" is fed to each of the switch means to disable or enable same. At such time as the gain range control means 64 is controlling, the states are supplied to the switch means as fast as the comparison circuits 56–62 can change states. In addition, as previously described, use of the octet amplifier stages 14–20 in combination with the four steps in the attenuator means 50 allows controlling the respective switch means to provide adjustment of the amplifier gain in X2 steps, which is equivalent to 6db steps. Thus, the invention combination provides relatively higher resolution then heretofore available in automatic gain ranging high performance amplifiers.

Regarding now FIGS. 5–8 there is shown in greater detail the rate gain computer means 68 depicted in FIG. 1 and partially described with reference to the gain range control means 64 of FIG. 4. In a preferred embodiment of the invention combination, each data sample value is digitally predicted before the sample (or samples) is taken, and the amplifier gain is set via digital control means shown in FIGS. 5–10 prior to actually taking the sample or samples. Thus, the gain of the multi-stage amplifier 22 is precisely controlled digitally at high speed such that the amplitude of each data sample taken is maximized to increase the analog-to-digital resolution of the sample, without driving the amplifier stages utilized into saturation. To this end, as previously described, comparison circuits 56–62 and the A/D converter 54 are coupled to the gain-ranging amplifier stages. The rate gain computer means 68 provides a plurality of control outputs $x$, $y$, $z$ which are coupled back into the amplifier 22 to control the stage selection and thus set the gain of the latter.

Figures 5, 6A, 6B, 6C, 7, 8, 9:
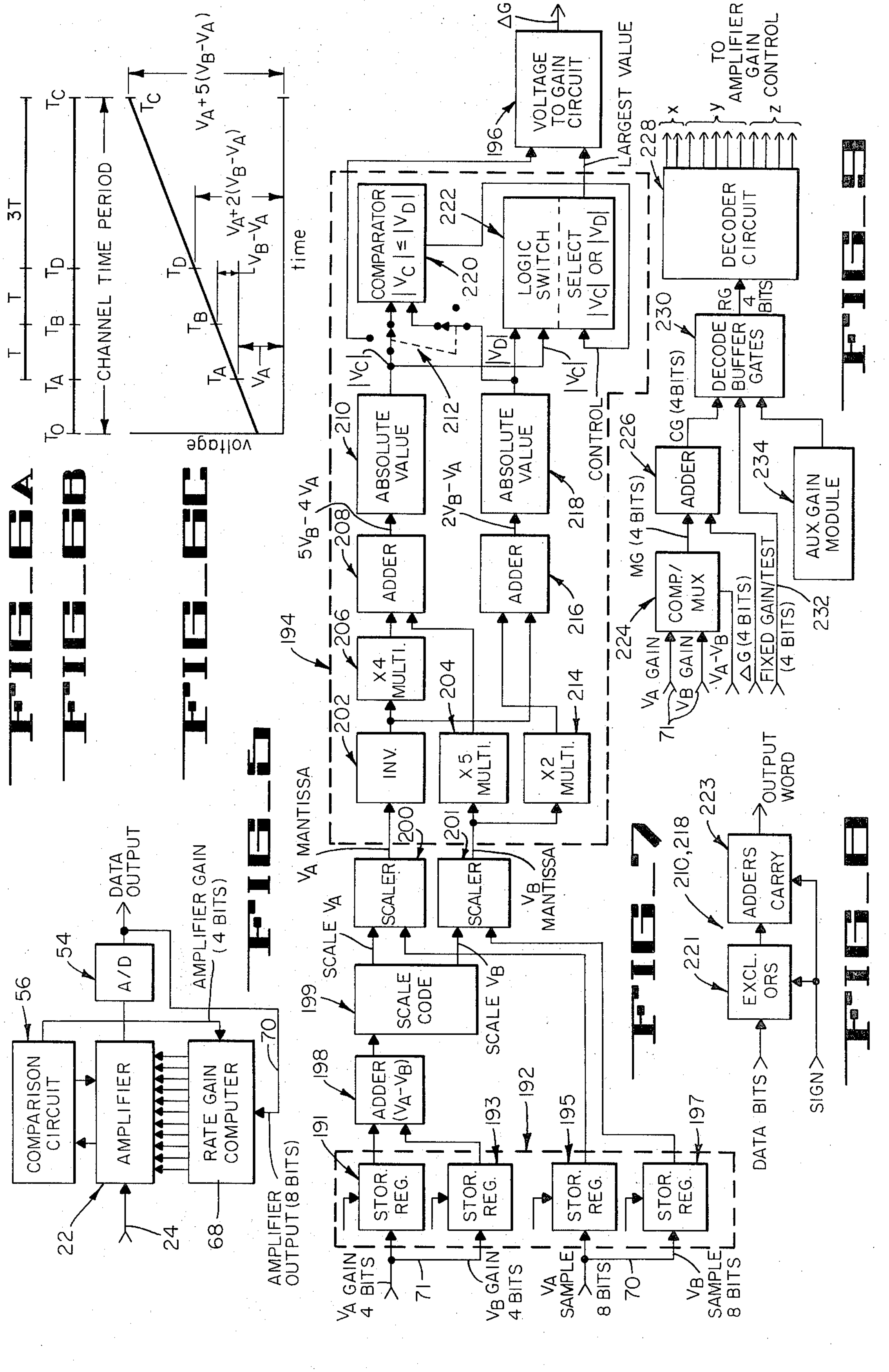
FIG. 5, 7, and 8 are block schematic diagrams showing in varying detail the rate gain computer means of the invention combination of FIG. 1.
FIGS. 6A-6C are graphs depicting the relationships of the various sampling times relative to the channel time period when predicting the gain for taking a single (or a plurality) data sample via the invention combination.
FIGS. 9 and 10 are block and schematic diagrams of a portion of the rate gain computer means of FIGS. 5–8.

Thus, the comparison circuits 56-62 depicted in the block diagram of FIG. 5, monitor the voltage levels of the incoming analog signals as individually depicted in FIGS. 1 and 2, and select the amplifier gain to maintain the output therefrom in a linear region prior, and between, the times $T_A$ and $T_B$ for taking the first two (prediction) samples. The channel time period of previous mention is depicted in FIG. 6 wherein $T_O$ is the start of the channel time period. At time $T_A$, which occurs a short time after $T_O$ (to allow the amplifier to settle) the A/D converter takes a first sample $V_A$ and stores the information in the digital rate gain computer means 68 in the form of, for example, an 8 bit word. The amplifier gain simultaneously is stored in the rate gain computer means 68 in the form of, for example, a 4 bit word. After another short period of time within the channel time period (time $T_B$) the A/D converter 54 takes a second sample $V_B$ which is also introduced to the digital rate gain computer means 68 as an 8 bit word, along with the 4 bit word amplifier gain. The computer means 68 subsequently digitally calculates the gain prediction for a third time (time $T_C$ or $T_D$) utilizing a straight line approximation circuit further described below, and sets the amplifier 22 to maximize the amplifier gain for the data sample $V_C$ or $V_D$ taken at the time $T_C$ or $T_D$ without saturating the amplifier 22. After the gain is determined and the stage is selected, the A/D converter 54 takes the actual data sample at the time $T_C$ or $T_D$ at maximum resolution, and delivers the data sample for subsequent processing, to a recording device, etc. Note that the sample $V_C$ is used to compute the gain only if, as shown, $V_B > V_A$. If $V_A > V_B$ then the predicted value $V_D$ is used by the circuit to compute the gain prior to taking the data samples.

Referring further to FIG. 6; the data time channel is sampled at time $T_A$ and $T_B$. The signal level at time $T_C$ and $T_D$ is then predicted using the straight line approximation. The following equations are used in the calculation:

$$V_{C,D} = V_A + X(V_B - V_A)$$

$$G_C = V_F / V_{C,D}$$

wherein $V_A$ = voltage at time $T_A$; $V_B$ = voltage at time $T_B$;

$V_{C,D}$ = voltage at time $T_{C,D}$; the prior voltage levels are referred to the amplifier input; $G_{C,D}$ = calculated amplifier gain at time $T_C$; and $V_F$ = the analog-to-digital full scale voltage level.

Accordingly, utilizing the notations of the equations and of FIG. 6C, the voltage at time $T_C$ is $V_C = V_A + 5 (V_B - V_A)$. The above equations representing the predicted gain values for the invention combination are further described relative to the circuits of FIGS. 7–20 infra.

Referring to FIG. 7, the rate gain computer means 68 is further detailed, and basically includes storage register means 192 for receiving the (8 bit) data words representing the prediction samples $V_A$ and $V_B$ from the A/D converter 54 via line 70, and the (4 bit) gain words representing the existing gain of the amplifier 22 when receiving the samples $V_A$ and $V_B$ via the "GAIN" line 71. The register means 192 is operatively coupled to an arithmetic unit 194, which in turn is coupled to a voltage-to-gain circuit 196. As further described below, the storage registers 191, 193, 195, 197 are generally conventional, comprising for example, six 4 bit latches, and the voltage-to-gain circuit 196 is a read-only memory which receives the maximum value of two inputs, converts this value to the difference gain, and sends it to final gain computation means in FIG. 9.

More particularly, the $V_A$ and $V_B$ gain inputs are introduced from the comparison circuits 56–62, through "GAIN" line 71 of the gain range control means 64, to the storage registers 191, 193 respectively, at such times ($T_A$ and $T_B$) that the "GAIN RANGE" line 154 goes low causing the latches 146–152 to latch as previously described (see FIG. 4). Registers 191, 193 are triggered to selectively output the gain words to an adder 198 which subtracts the $V_B$ gain from the $V_A$ gain and introduces the summation to a scale code circuit 199. The latter computes the correction factor required in order to normalize the $V_A$ and $V_B$ data samples to the same exponent, whereby the greater of $V_A$ or $V_B$ data samples corresponding to the lesser of $V_A$ or $V_B$ gain samples, is scaled down appropriately, resulting in $V_A$ and $V_B$ MANTISSAs which are unique digital representations of the voltages sampled at $T_A$ and $T_B$. The scale code circuit 99 thus computes the scale factor, and enables either the scale $V_A$ or scale $V_B$ lines to scalers 200, 201 respectively.

The storage registers 195, 197 introduce the (8-bit) data words representing prediction samples $V_A$, $V_B$ to the scalers 200, 201 respectively, whereupon the latter circuits deliver a $V_A$ and $V_B$ MANTISSA output on the corresponding lines coupled to the arithmetic unit 194. The arithmetic unit 194 includes means, described below, for calculating the gain prediction at the subsequent time $T_{C,D}$ which value is then introduced to the voltage-to-gain circuit 196. The output from the latter circuit 196 is utilized to set the gain of the binary gain amplifier 22 of FIG. 1.

The arithmetic unit 194 is shown in further detail for the embodiment wherein a series of four samples are taken ranging from time $T_D$ through $T_C$ as shown in FIG. 6C. Regarding first the circuit for computing the sample at time $T_C$, the input lines $V_A$ and $V_B$ MANTISSA which carry the information $V_A$, $V_B$ corresponding to time samples $T_A$, $T_B$ respectively, are coupled to an inverter circuit 202 and a X5 multiplier 204, respectively. Inverter circuit 202 is a generally conventional circuit which provides a twos complement of the digital input $V_A$, and is coupled to a X4 multiplier 206 and thence to an adder circuit 208. The X5 multiplier 204 is coupled to the adder circuit 208 directly. The output of adder 208 thus corresponds to the value of $5V_B$-$4V_A$. An absolute value circuit 210 is coupled to the adder circuit 208, and provides the absolute value $|V_C|$ of $5V_B$-$4V_A$.

However, in accordance with the further details of the circuit of FIG. 7, the gain for a multiple number of sample points may be "predicted" and the samples taken, to provide a sample averaging effect which improves the signal-to-noise ratio of the output signal from the A/D converter 54. To this end, a X2 multiplier 214 is also coupled to the scaler 201 to receive the sample $V_B$ corresponding to time $T_B$, which multiplier 214 in turn is coupled to an adder circuit 216. The output from the inverter circuit 202 is also fed to the adder circuit 216. The utput from adder circuit 216 thus equals the value of $2V_B$-$V_A$ which is fed to a second absolute value circuit 218 which provides an output equal to the absolute value $|V_D|$ of the sample taken at time $T_D$.

In the latter more sophisticated circuit for taking several samples, the outputs of both the absolute value circuits 210, 218 are introduced to a digital comparator 220, wherein the two values are compared to determine the largest absolute value and an appropriate control signal to logic switch 222 is generated. Logic switch 222 also receives the outputs $|V_C|$ and $|V_D|$ directly from the circuits 210, 218 whereby the largest absolute value, i.e., either $V_A + 5(V_B$-$V_A)$ or $V_A + 2(V_B$-$V_A)$ is selected and introduced as the gain representing value to the voltage-to-gain circuit 196 of previous mention. The output from he voltage-to-gain circuit 196 is fed to the final output gain calculation means with respect to FIG. 9 below.

The various components shown above are generally conventional in the field of logic circuitry, and accordingly, are not described in great detail herein. By way of example only, the comparator 220 is a conventional digital comparator such as fabricated by National, Model DM 8,200. The logic switch 222 is a switch means having, or example, eight or ten poles with a double throw, wherein a control input from the comparator 220 determines which of the absolute values $|V_C|$ or $|V_D|$ is the larger, whereby switch 222 is switched to pass the larger of the two signals introduced thereto directly from the circuit 210, 218. The adders 208 and 216 are conventional circuits such as designated SN-7483 manufactured by Texas Instruments.

FIG. 8 depicts in more detail the absolute value circuits 210, 218, and includes a series of exclusive OR gates 221 coupled to receive the data words from respective adders 208, 216 of FIG. 7. Adder means 223 is coupled to the gates 221 and provides the absolute value for whatever value is input to the gates 221, i.e., provides a twos complement for a negative input. A SIGN input also is introduced to the gates 221 and the adder means 223. Thus, to provide a positive quantity, the twos complement word is introduced to the series of exclusive OR gates 221, one gate per bit. The SIGN bit of the twos complement arithmetic word is introduced to the CARRY input of adder means 223, wherein there is one adder per bit. If the SIGN bit is a "1," which implies that the twos complement word is negative, then it is inverted via the exclusive OR gate 221 to form an inversion function, and a "1" is added to the least significant bit. This process provides the twos complement of the word, i.e., takes the negative of the word, i.e., results in the absolute value. If the SIGN bit of the data word is a "0," implying that it is a positive word, the exclusive OR gates 221 perform a non-inverting function and do not add a CARRY to adder means 223. That is, the absolute value circuit (210, 218) does not need to function when the word is positive.

Figure 10:
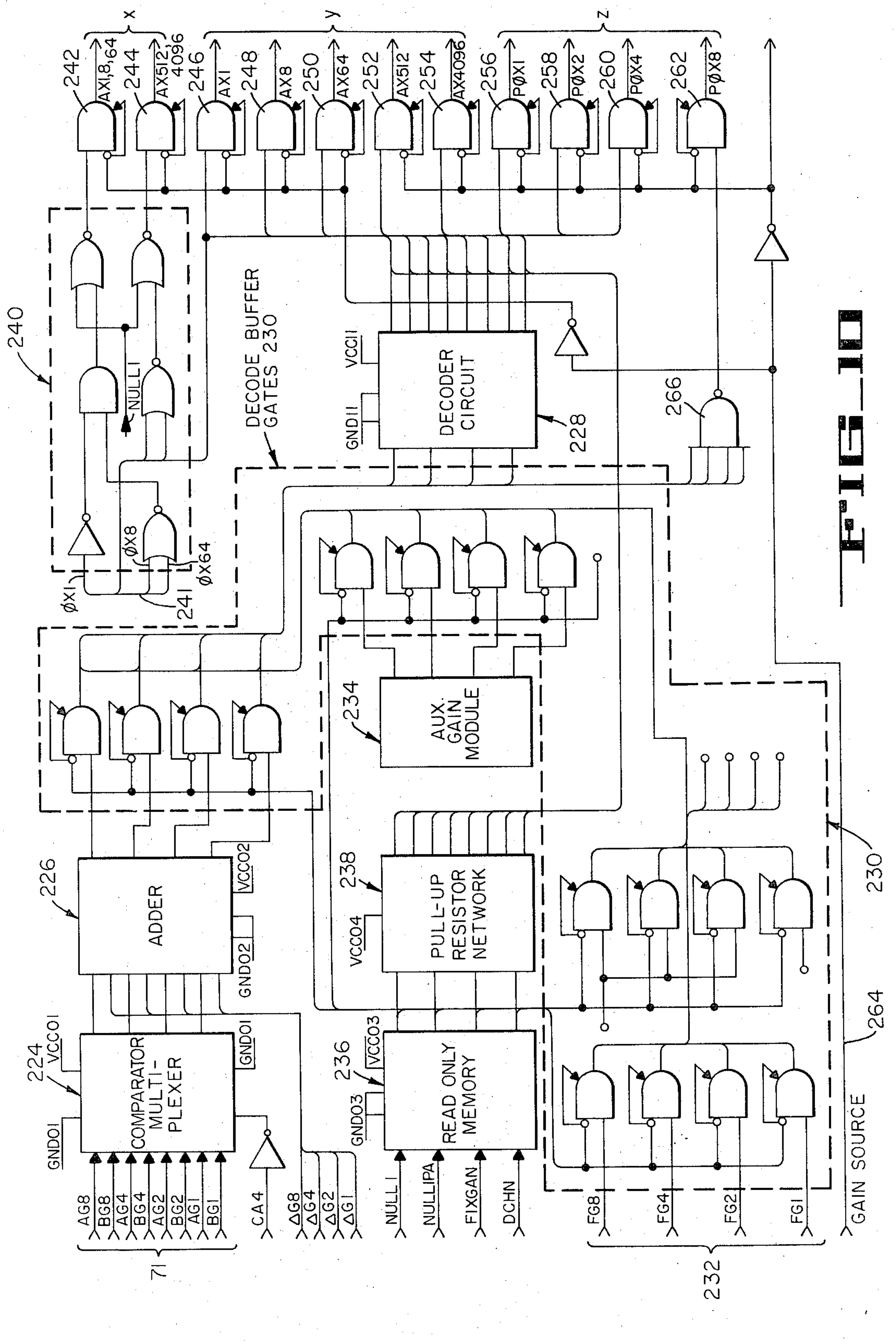

FIG. 9 and FIG. 10 shows a block and schematic diagram respectively of a portion of the rate gain computer means 68 previously described in FIGS. 5–8. It may be seen that the circuit converts the difference or Δgain code which has been calculated by the previous portion of the rate gain computer means 68, specifically, by the voltage to gain circuit 196 of FIG. 7, to provide a final gain code which represents the gain to which the amplifier is to be set. The final gain is optimum in the sense that it keeps the output from the amplifier 22 in the upper scale region of the A/D converter 54, yet it prevents the amplifier from saturating.

More particularly, a comparator/multiplexer 224 receives the $V_A$ and $V_B$ gain inputs, which are the same gain inputs to the storage registers 191, 193 of previous FIG. 7. The $V_A$ gains are the exponents for the $V_A$ samples, and the $V_B$ gains are the exponents for the $V_B$ samples. The comparator/multiplexer 224 is generally similar to the combination of the comparator 220 and the logic switch 222 of FIG. 7, wherein the comparator/multiplexer 224 selects the lower gain, i.e., picks the smallest exponent (which represents the gain) which in turn represents the largest signal, and generates an output "MG" in the form of a four bit word. The smaller gain is selected according to an input $V_A$-$V_B$ to the comparator/multiplexer 224, described previously as in FIG. 5. An adder 226 receives the smaller gain "MG" and also as input "ΔG" in the form of a 4 bit word, wherein the latter is the difference gain which has been calculated by the previous portion of the rate gain computer shown in FIG. 7, i.e., the output ΔG from the voltage to gain circuit 196. The adder 226 provides a 4 bit word output labeled "CG" which is the summation of the inputs thereto and represents the gain to which the amplifier 22 is set when taking the data sample, or samples in the case of the more sophisticated circuitry of FIG. 7. The gain code output "CG" is the desired output for setting the gain, but is not in a form that can be fed to the amplifier. Accordingly, the gain code "CG" is fed to a decoder circuit 228 via a series of decode buffer gates 230 as input "RG" in the form of a 4 bit word. The decoder circuit 228 output is then introduced to the amplifier gain controls, i.e., the octet amplifier and pick-off amplifier switch means 26–30, 36, 38 and 116, 118 of FIGS. 1 and 3 respectively, as the controls *y, z* of previous mention.

Other gain inputs are provided to the decoder circuit 228 via action of the decode buffer gates 230, and comprise for example a "FIXED GAIN" or "TEST" input in the form of a 4 bit word, herein numbered 232. In addition, an auxiliary gain module 234 provides select gains for setting the amplifier to some particular state, and comprises a hardwired module including a component board for manually selecting a code representing the desired gain. The auxiliary gain module 234 is employed when the amplifier is coupled to auxiliary channels.

Accordingly, the circuit of FIGS. 9 and 10 provides various means for choosing auxiliary gains, fixed gains, null channel gains, or for utilizing the information generated via the computations from the rate gain computer shown in FIG. 7. That is, a fixed gain can be entered via lines 232 and decode buffer gates 230. Or the auxiliary gain module 234 output may be selected via the decode buffer gates 230 when the amplifier is switched to the auxiliary channel mode.

FIG. 10 shows in greater detail the various blocks of FIG. 9 wherein like numerals are utilized for like components. As may be seen, the decode buffer gates 230 comprise four different sets of four tri-state buffer gates similar to buffer gates 162–182 of FIG. 4. In addition, the FIG. 10 circuit includes a readonly memory 236 which has various inputs thereto; i.e., a pair of "NULL" inputs, a "FIXED GAIN" input, and a "DATA CHANNEL" input. The read-only memory 236 selects which of the groups of decode buffer gates are to be enabled to thus dictate whether the output of the rate gain computer is to be utilized, or whether one of the various auxiliary or fixed gain inputs are to be fed to the decoder circuit 228, depending upon the channel mode of operation of the amplifier. The output lines from the read-only memory 236 provide one output which is always low while the other three are high, whereby one of the various modes of operation, i.e., the fixed gain, the auxiliary, the null, or the automatic modes, are selected depending upon what the memory 236 decodes from its inputs. Thus the read-only memory 236 determines the control of the decoder circuit 228; i.e., it determines whether the decoder circuit 228 decodes the information from the rate gain computer, the fixed gain information, the null channel gain information, or the auxiliary channel gain information.

A pull-up resistor network 238 is provided for the read-only memory 236 and the decoder circuit 228 since they both have open collector outputs, whereby the pull-up resistor network 238 provides voltage pull-up in the logic one state. A logic circuit 249 provides the signals to the buffer gates 242–244, which provide the $x$ signals during a selected portion of the channel. However, under certain conditions, such as during the null process when the amplifier is coupled to the offset nulling means, the gates 242, 244 are disabled via the "NULL 1" input to the logic gates 240 to prevent selection of the two buffer switch means 242, 244.

The second inputs to all the gates 242-262 is by way of the "GAIN SOURCE" line 264, which corresponds to the "GAIN SOURCE" line 184 of the gain range control means 64 of FIG. 4. Buffer gate 262 has its first input coupled via a NAND gate 266 to one of the groups of the buffer gates of the decode buffer gates 230, providing a similar function to decoder circuit 228.

Accordingly, the function of the circuits of FIGS. 9, 10 is to take the rate gain information and computer a final gain, then to decode the gain and introduce the same to the switch means select lines via the buffer gates 242–262, and secondly to provide a preselected fixed gain for a select channel of information to decode the fixed gain and introduce same to the control lines in the same manner as the rate gain. Thus, the output of the circuit of FIGS. 9, 10 is nothing more than the actual control lines ($x$,$y$,$z$) which select the suitable switch means to set the gain of the amplifier accordingly. The inputs to the circuit are information from the rate gain computer, the $V_A$ and $V_B$ sample gains, and selected gain information introduced via the read-only memory 236 and decode buffer gates 230 to provide selective switching for test, auxiliary, etc., purposes.

Regarding now the graph of FIGS. 11A-11J, there is depicted the timing sequence of various waveforms generated by the invention circuits over a selected channel time period of, for example, 31 micro-seconds. The channel-and-segment control means 72 of previous mention in FIG. 1 provides clock pulses which are fed to a read-only memory which, in turn, provides various pulses which are fed to the amplifier circuitry for logic control. The control means 72 further provides the preselected channel time period during which sampling is performed via the amplifier in accordance with the invention. Thus as depicted in FIG. 11A, control means 72 generates a channel period of, for example, 31 microseconds, which is divided into 120 segments of approximately 260 nanoseconds each. FIG. 11B depicts the convert pulse which is delivered via the channel-and-segment control means 72 to the A/D converter 54 of FIG. 1, which enables the latter to begin the conversion of the particular sample being taken. The first pulse is delivered to the A/D converter 54 at time $T_A$, whereupon the A/D converter takes the sample $V_A$. The second pulse is delivered at time $T_B$ whereupon the A/D converter 54 takes the second prediction sample $V_B$. These two samples are introduced to the rate gain computer means 68 via line 70, and per previous description with reference to FIGS. 7–10, are used to predict the gain of the subsequent samples (4) taken between the time pulses $T_D$ and $T_C$ of FIG. 11B. These latter four samples are those provided via action of the sophisticated alternative circuit of FIG. 7 supra, and are subsequently added together and divided by four in a simple average technique to provide a data sample.

FIGS. 11 H and 11J depict the waveform generated within the channel-and-segment control means 72 and introduced therefrom as the "GAIN SOURCE" control and the "GAIN RANGE" control via lines 184, 264 and 154 respectively of FIGS. 4 and 10. As may be seen, the "GAIN RANGE" control is high during the gain ranging mode of operation of the amplifier 22, whereupon "GAIN RANGE" goes low when taking the samples $T_A$, $T_B$ in order to latch the flip-flop latches 146–152 of FIG. 5. At this time the convert pulses shown in FIG. 11B are introduced to the A/D converter 54 which, in turn, introduces the prediction samples $V_A$, $V_B$ to the rate gain computer means 68 for gain prediction purposes. Upon taking the sample at time $T_B$ the "GAIN RANGE" control stays low, and a few microseconds later the "GAIN SOURCE" control goes high. At this time the rate gain computer means 68 has predicted the desired gain for taking the data sample or samples, has disabled the controls from the gain range control means 64, and has set the desired gain of the amplifier via its control lines. Thus, the "GAIN SOURCE" control transfers control away from the comparison circuits 56–62 and the "GAIN RANGE" control means 64, into the rate gain computer means 68 and particularly to he portion of the circuit thereof described in FIGS. 9 and 10.

FIG. 11C is a timing signal sent to the conventional sample-and-hold circuit (not shown) of the A/D converter 54, and along with the waveform signal of FIG. 11D, is an indication of the speed of the A/D converter. The latter signal is returned to the rate gain computer means 68.

An A/D converter inverter sync pulse is shown in FIG. 11E which determines that the power supplies for the A/D converter have their switching spikes only at times which do not interfere with the data being taken. Thus, the switching spikes are regulated so as not to modify the data.

The FIGS. 11F, G are waveforms of signals related to the input circuit (e.g., the multiplexer, not shown) which provide for a make-before-break action, whereby the multiplexer cards corresponding to the channels therein are selected before deselecting the previous card.

It is to be understood that the waveforms of the FIGS. 11C-G and the associated apparatus are generally conventional in the art and therefore are not further described herein with reference to the invention combination.

We claim:

1. A high performance gain-ranging amplifier system including a plurality of serially-coupled fixed gain amplifier stages disposed to receive analog signals and to generate normalized data samples via an analog-to-digital converter at optimum amplifier gain while precluding amplifier stage saturation, comprising:

digital amplifier control means coupled to the amplifier stages to digitally detect and set the gain of the amplifier system to normalize data samples taken by the analog-to-digital converter, said amplifier control means including:

gain range control means for continuously detecting the analog signal levels of each amplifier stage during a selected first portion of a channel time period, and for continuously selecting the optimum amplifier gain in response to the detected levels to maintain the amplifier output in a linear region; and rate gain computer means operatively coupled to the analog-to-digital converter and to the gain range control means to take samples of the amplifier system output at selected times within the first portion of the channel time period via the analog-to-digital converter, and to predict and set accordingly the gain of the amplifier system for a subsequent portion of the channel time period for the purpose of taking the normalized data samples.

2. The amplifier system of claim 1, further comprising pickoff amplifier means continuously coupled to a selected stage of the amplifier system in response to the analog signal levels detected by the gain range control means to continuously maintain said optimum amplifier gain, said pickoff amplifier means being coupled to a selected stage in response to the rate gain computer means to set the gain of the amplifier system in accordance with the gain predicted for the remainder of the channel time period during which the normalized data samples are taken by the analog-to-digital converter.

3. The amplifier system of claim 2 wherein said rate gain computer means includes gain prediction means for determining and setting the gain of the amplifier system prior to taking the normalized data samples.

4. The amplifier system of claim 3, further comprising:

switch means operatively coupled between each of the amplifier stages and the pickoff amplifier means for coupling the selected stage to the pickoff amplifier means; and comparison means coupled to the plurality of amplifier stage outputs to continuously detect the respective analog signal levels of each stage during the selected first portion of the channel time period.

5. The amplifier system of claim 4, further comprising isolation/buffer means for electrically isolating the amplifier stages, said isolation/buffer means including a first unity amplifier defining the input stage to the plurality of amplifier stages and a second unity amplifier disposed between the switch means and the pickoff amplifier means.

6. The amplifier system of claim 5 wherein the gain range control means is coupled to the comparison means to continuously receive the signal levels detected thereby during the selected first portion of the channel time period, said switch means being responsive to the gain range control means to continuously range up and down the amplifier stages to couple the selected stage to the pickoff amplifier means to provide the output within the linear region.

7. The amplifier system of claim 6, wherein the pickoff amplifier means further includes a pickoff amplifier of selected gain and an attenuator means coupled between the second unity amplifier of the isolation means and the pickoff amplifier to define a selected series of gain steps of selected value.

8. The amplifier system of claim 7, wherein the switch means further includes a first plurality of electronic switches operatively coupled to respective outputs of the plurality of amplifier stages, a first common output buss coupled to a selected number of the first plurality of electronic switches, a second common output buss coupled to the remaining electronic switches of the first plurality, and a second plurality of electronic switches coupled between the first and second common output busses and the second unity amplifier of said isolation means.

9. The amplifier system of claim 3, wherein the gain prediction means includes means coupled to the analog-to-digital converter and to the gain range control means for taking first and second samples within the selected first portion of the channel time period to predict the gain for the data samples to be subsequently taken during the subsequent portion of the channel time period and to set the gain of the amplifier system prior to taking the subsequent data samples.

10. The amplifier system of claim 8, further including signal limiting means coupled to each amplifier stage for limiting the maximum amplitude of the output signals therefrom to determine a selected maximum amplitude and to preclude overloading the succeeding amplifier stage.

11. The amplifier system of claim 8, further including feedback null loop means integral with each amplifier stage of said plurality to determine DC and low frequency AC offset and circuit drift inherent therein and to provide a feedback voltage representative thereof to correct for said offset and drift.

12. An amplifier gain prediction circuit for controlling the gain ranging of a high performance amplifier system including a plurality of serially coupled fixed gain amplifier stages, comprising:

analog-to-digital converter means coupled to the output of the amplifier system; and digital rate gain computer means operatively coupled from the analog-to-digital converter means to the amplifier system to take first and second samples $V_A$ and $V_B$ at times $T_A$ and $T_B$ respectively within a selected channel time period, to predict the gain for at least a data sample $V_C$ to be taken at a later time $T_C$, and to set the gain of the amplifier system prior to taking the data sample $V_C$.

13. The gain prediction circuit of claim 12, further including voltage level detector means coupled to the amplifier stages for initially selecting amplifier gain values which keep the output of the amplifier stages in a linear region and for delivering the gain values to said gain computer means.

14. The gain prediction circuit of claim 13, wherein the gain computer means further includes:

storage register means coupled to the analog-to-digital converter means to receive and temporarily store the first sample $V_A$ taken at time $T_A$;

an arithmetic unit coupled to said storage register means to receive the stored sample $V_A$, and coupled to the analog-to-digital converter means to receive the sample $V_B$ at time $T_B$; and a voltage-to-gain circuit coupled between the arithmetic unit and the amplifier system to generate an amplifier gain value for setting the amplifier system gain during taking of the sample $V_C$ at time $T_C$.

15. The gain prediction circuit of claim 14 wherein said arithmetic unit includes a digital straight line approximation circuit for predicting the gain at time $T_C$ from the samples $V_A$ and $V_B$.

16. The gain prediction circuit of claim 15, wherein the arithmetic unit further includes:

inverter means coupled to the analog-to-digital converter means for generating a one complement from the sample $V_A$;

arithmetic circuits coupled to the inverter means and to the analog-to-digital converter means for generating a pair of data signals representing the absolute value of selected multiples of the samples $V_A$ and $V_B$.

17. The gain prediction circuit of claim 16, wherein the arithmetic circuit include:

multiplier means coupled to the inverter means and to the analog-to-digital converter means for receiving the samples $V_A$ and $V_B$ respectively therefrom;

adder means coupled to the multiplier means; and an absolute value coupled between the adder means and the voltage-to-gain circuit.

18. The gain prediction circuit of claim 15, wherein said arithmetic unit further includes:

a second digital straight line approximation circuit for predicting the gain at a time $T_D$ between $T_B$ and $T_C$ from the samples $V_A$ and $V_B$;

comparator means coupled to the approximation circuits for comparing the absolute values therefrom; and logic switch means for introducing the largest of the absolute values from the approximation circuits to the voltage-to-gain circuit in response to the output from the comparator means.

* * * * *

UNITED STATES PATENT OFFICE
CERTIFICATE OF CORRECTION

Patent No. 3,813,609 Dated May 28, 1974

Inventor(s) Don Earl Wilkes; Charles Larry Thompson; Alan Fred Sedgwick

It is certified that error appears in the above-identified patent and that said Letters Patent are hereby corrected as shown below:

In the Abstract:

Col. 2, line 2, "means A" is corrected to read --means. A--.

Col. 2, lines 7-8, "continuously which" is corrected to read --which continuously--.

In the Specification:

Col. 4, line 15, "by" is corrected to read -- from the output of --.

Col. 6, line 10, "counted" is corrected to read --coupled--.

Col. 12, line 4, "99" is corrected to read --199--.

Col. 12, line 45, "utput" is corrected to read --output--.

Col. 12, line 60, "he" is corrected to read --the--.

Col. 13, line 2, "or" is corrected to read --for--.

Col. 14, line 67, "249" is corrected to read --240--.

Col. 16, line 7, "FIG. 5" is corrected to read --FIG. 4--.

Col. 16, line 22, "he" is corrected to read --the--.

In the Claims:

Col. 19, line 10, after "value" insert --circuit--.

Signed and sealed this 17th day of December 1974.

(SEAL)
Attest:

McCOY M. GIBSON JR.
Attesting Officer

C. MARSHALL DANN
Commissioner of Patents